(12) United States Patent
Ruijs

(10) Patent No.: US 8,217,707 B2
(45) Date of Patent: Jul. 10, 2012

(54) THERMAL CONTROL SYSTEM AND METHOD FOR OPERATING AN INTEGRATED CIRCUIT

(75) Inventor: Leonardus C. H. Ruijs, Oss (NL)

(73) Assignee: ST-Ericsson SA, Geneva (CH)

( * ) Notice: Subject to any disclaimer, the term of this patent is extended or adjusted under 35 U.S.C. 154(b) by 445 days.

(21) Appl. No.: 12/310,214

(22) PCT Filed: Aug. 10, 2007

(86) PCT No.: PCT/IB2007/053194
§ 371 (c)(1),
(2), (4) Date: Nov. 25, 2009

(87) PCT Pub. No.: WO2008/020387
PCT Pub. Date: Feb. 21, 2008

(65) Prior Publication Data
US 2010/0066432 A1 Mar. 18, 2010

(30) Foreign Application Priority Data
Aug. 16, 2006 (EP) .................................. 06118979

(51) Int. Cl.
*H03K 17/14* (2006.01)
*G05F 1/567* (2006.01)

(52) U.S. Cl. .................. 327/513; 327/540; 323/907

(58) Field of Classification Search ............... None
See application file for complete search history.

(56) References Cited

U.S. PATENT DOCUMENTS

| | | |
|---|---|---|
| 5,287,292 A | 2/1994 | Kenny et al. |
| 5,519,886 A | 5/1996 | Gilbert et al. |
| 5,848,062 A * | 12/1998 | Ohno .......................... 370/311 |
| 7,075,847 B2 * | 7/2006 | Kim et al. ..................... 365/222 |
| 7,576,525 B2 * | 8/2009 | So et al. ....................... 323/276 |
| 2001/0021217 A1 | 9/2001 | Gunther et al. |
| 2003/0074591 A1 | 4/2003 | McClendon et al. |

FOREIGN PATENT DOCUMENTS

WO WO 01/20933 A1 3/2001

OTHER PUBLICATIONS

International Search Report dated Apr. 14, 2009 in connection with PCT Patent Application No. PCT/IB2007/053194.
Dr. Stephan Weber, et al., "Power Controller for Dual Band TDMA Power Amplifiers", Radio Frequency Integrated Circuits (RFIC) Symposium, IEEE, May 20, 2001, 4 pages.
Angel Lozano, et al., "Integrated Dynamic Channel Assignment and Power Control in TDMA Mobile Wireless Communication Systems", IEEE Journal on Selected Areas in Communications, vol. 17, No. 11, Nov. 1999, p. 2031-2040.

* cited by examiner

*Primary Examiner* — Lincoln Donovan
*Assistant Examiner* — Terry L Englund

(57) ABSTRACT

According to one embodiment, a system and method for operating an Integrated Circuit (IC) includes inputting power to the IC in bursts, sensing an IC temperature using a temperature sensor, operating the IC by controlling the power to be outputted by the IC during the burst in dependence on the sensed IC temperature compared to a reference IC temperature using a controller, wherein the IC temperature is obtained at a predetermined moment prior to a start of the burst, and the IC is operated by setting an allowable power to be outputted by the IC prior to the start of the burst.

10 Claims, 5 Drawing Sheets

THERMAL CONTROL SYSTEM AND METHOD FOR OPERATING AN INTEGRATED CIRCUIT

CROSS-REFERENCE TO RELATED APPLICATION(S)

The present application claims priority under 35 U.S.C. §365 to International Patent Application No. PCT/1132007/053194 filed Aug. 10, 2007, entitled "OPERATING AN INTEGRATED CIRCUIT". International Patent Application No. PCT/IB2007/053194 claims priority under 35 U.S.C. §365 and/or 35 U.S.C. §119(a) to European Patent Application No. 06118979.1 filed Aug. 16, 2006 and which are incorporated herein by reference into the present disclosure as if fully set forth herein.

FIELD OF THE INVENTION

The invention relates to operating an Integrated Circuit (IC) and in particular to operating such ICs that handle power in bursts.

BACKGROUND OF THE INVENTION

When operating an IC a number of methods and systems have been provided in order e.g. to guarantee a stable, reliable and/or long lasting performance of the IC. The inventor of the present invention has assessed that reference methods and systems does suffer from problems related to a missing performance, such as a poor stability, especially under certain conditions and/or suffers from a limited lifetime. In particular, the inventor of the present invention has assessed that IC systems which will be seen in the market in the years to come may in particular suffer from one or more problems, such as the problems briefly discussed in the above.

Therefore the inventor of the present invention has appreciated that an improved method of operating an IC, an improved IC controller and improved IC system comprising the IC controller among others is of benefit, and has in consequence devised the present invention.

SUMMARY OF THE INVENTION

It may be seen that the present invention addresses to provide an improved method of operating an IC, an improved IC controller and improved IC system comprising the IC controller.

Preferably, the invention alleviates, mitigates or eliminates one or more of the above or other disadvantages singly or in any combination.

To guarantee a certain lifetime of an IC, IC temperatures may not exceed a certain maximum IC temperature, in some case at least not for a time period over certain duration. An IC temperature is among others a function of energy unwantedly dissipated in the IC. The unwanted dissipated energy, and hereby a normally unwanted heat generated by the IC, may be due to factors such as loss of energy due to an efficiency of a process within the IC being less than 100%. An amount of dissipated energy in the IC is among others also a function of a power to be outputted by the IC.

Furthermore the IC temperature is among others also a function of a thermal resistance of the IC to its environment and a temperature of the environment. Under certain conditions, such as conditions where the efficiency of the IC is relatively low, and thereby an increased amount of energy is normally dissipated in the IC temperature of the IC can become higher.

For systems such as TDMA (Time-Division Multiple Access systems) (e.g. GSM—where GSM formerly identified the Groupe Speciale Mobile of the European Telecommunication Standards Institute; today it is a worldwide standard) the power is supplied to an IC in the system in bursts. In an example of a power amplification IC, the power, or 'signal' or 'signal power', outputted by the IC is normally an amplified version of the power, or 'signal' or 'signal power' inputted to the IC, thus both in bursts. Extra energy for the outputted amplified signal is provided from an additional supply source, such as a battery.

Supplying the power in burst makes the IC warm up in every burst and cool down between the bursts. In every burst the maximum allowable IC temperature might be exceeded again. The energy is mainly generated in a relative small part of the IC, such as in a transistor junction of the IC, and must travel through the IC to reach an IC temperature sensor.

In most present ICs the thermal resistance is low enough to prevent exceeding the maximum IC temperature. However, because dies and hereby ICs are getting smaller, the thermal resistance to the environment increases. The dissipated power and the ambient temperature are not significantly changed and as a possible consequence the temperature of the ICs may increase.

Accordingly, in a first aspect of the invention there is provided a method of operating an IC, the method comprising:
inputting power to the IC in bursts using a power supply, and
sensing an IC temperature using a temperature sensor, and
operating the IC by controlling the power to be outputted by the IC during a burst in dependence of the sensed IC temperature compared to a reference IC temperature using a controller, and
wherein the IC temperature is sensed prior to a start of a burst and hereby the IC temperature is obtained at a predetermined moment prior to a start of a burst, and wherein operating the IC by controlling the power to be outputted by the IC is provided by setting an allowable power to be outputted by the IC prior to the start of the burst.

Thus a method of operating an IC is provided by which method a possible obtained advantage is that the method allows operation of the IC such as to control and limit the temperature of the IC. A further possible advantage is that control of the IC temperature is provided while the burst remains unchanged, e.g. a predetermined profile of the burst is unchanged such as "un-chopped" or constant, during the burst.

In an embodiment of the invention the power to be outputted by the IC is only limited when the IC temperature is higher than the reference IC temperature and not limited when the IC temperature is below the reference IC temperature.

In an embodiment of the invention the allowable power may be set as an allowable maximum power. The allowable power to be outputted by the IC is set prior to the start of the burst and may be set as an allowable power to be outputted during a certain time period such as during a burst, such as during a next burst, such as during a next burst when the predetermined IC temperature was obtained at a predetermined moment during a previous burst followed by the next burst.

In an embodiment of the invention, the IC temperature may be sensed continuously or may be sensed at least once, e.g. within a period from a start of a previous burst and before the start of a next burst. In principle the IC temperature may in accordance with an embodiment of the invention be sensed continuously, still enabling the power to be outputted by the IC in the next burst to be regulated prior to the next burst in dependence of the comparison of the IC temperature sensed prior to the start of the next burst with the reference temperature.

In an embodiment of the invention it is suggested to provide a sample of the die temperature at a predetermined moment prior to the start of the next burst, where this predetermined moment is determined in the same way every time the die temperature is sampled. As an alternative to sampling the IC temperature, the IC temperature may be sensed at least once such as during a part of the previous power burst prior to an end of the previous power burst, and hereby the IC temperature, e.g. at the end of the previous burst, can be calculated, hereby also obtaining the IC temperature at the predetermined moment prior to the start of the next following burst.

The change or regulation of the power to be outputted during the burst, and possibly to be provided as a consequence of the set allowable power, may in principle and in accordance with an embodiment of the present invention be changed at any moment after the IC temperature is sensed and prior to the start of the burst.

In an embodiment of the invention, a sample of the sensed IC temperature is provided and the sampled IC temperature is used as the IC temperature obtained at the predetermined moment prior to the start of the burst.

Providing the IC temperature at a predetermined moment using a sample and hold provides an advantageous way of providing a single temperature prior to the start of the burst to be used for controlling the burst.

In an embodiment of the invention, a sample of the sensed IC temperature is obtained at the end of a previous burst and the sampled IC temperature is used for setting a maximum allowable power to be outputted by the IC prior to the start of a next burst.

A possible advantage hereby is that the junction temperature at the sample moment is very close to or at its maximum temperature and hereby a possible advantage is that the most precise knowledge of the actual maximum junction temperature is provided. When the junction temperature is very close to or at its maximum temperature the IC temperature at the sensor is also very close to or at its maximum temperature.

In an embodiment of the invention, the power to be outputted by the IC is controlled by a regulation of the power to be inputted to the IC, the regulation being provided prior to the burst. By regulating the power to be inputted to the IC prior to the burst, a possible advantage may be that the burst remains unchanged during the burst.

In an embodiment of the invention, the power to be outputted by the IC is controlled by a regulation of a gain of a power amplification, which power amplification is provided by the IC and wherein the regulation is provided prior to the burst. By regulating the gain of the power amplification provided within the IC prior to the burst, a possible advantage may be that the burst remains unchanged during the burst.

In an embodiment of the invention, a regulation of the power to be outputted by the IC in a next burst is only provided in a period between an end of a previous burst until a start of the next burst.

In an embodiment of the invention, the power to be outputted by the IC in a next burst is controlled in dependence of a sampled and held IC temperature obtained during a previous burst prior to the next burst, which sampled and held IC temperature is compared to the reference IC temperature.

In an embodiment of the invention, setting the maximum level of power to be outputted by the IC during the burst, results in the power to be outputted by the IC being decreased when the IC temperature obtained at the predetermined moment prior to the start of the burst is higher than the reference IC temperature.

As an alternative to decreasing the power outputted by the IC, the power outputted by the IC may be increased when the IC temperature obtained at the predetermined moment prior to the start of the burst is lower than the reference temperature. Still further a result of the set maximum limit may also be that the power to be outputted by the IC is preserved.

In a second aspect of the invention, the invention relates to an IC controller intended for use with an IC and a power supply supplying power to the IC in bursts, and adapted for use with a temperature sensor sensing an IC temperature, the IC controller comprising:

an input for inputting the sensed IC temperature
a device for accessing a reference IC temperature
a control output for outputting a control signal
a control logic, wherein the control logic is adapted to
obtain the IC temperature at a predetermined moment prior to a start of a burst, and
to operate the IC by controlling the power to be outputted by the IC by outputting a control signal, the control signal comprising a signal for setting an allowable power to be outputted by the IC, the allowable power being set prior to the start of the burst and the control signal being set in dependence of a comparison of the obtained IC temperature obtained at the predetermined moment with the IC reference temperature.

A controller is thus provided of which controller a possible advantage is that the controller may be used to control the temperature of the IC in an advantageous way, e.g. leaving the burst unchanged during the burst. Leaving the burst unchanged during the burst, e.g. due to obtaining the IC temperature at a predetermined moment prior to a start of a burst and controlling the power to be outputted by the IC by outputting a control signal comprising a set maximum allowable power to be outputted by the IC, where the maximum allowable power is set prior to the start of the burst, may have the possible advantage of an improved stability of the IC.

The die temperature sensed may be provided as measuring a signal correlated to the IC temperature. The correlated signal may as an example be a voltage over a temperature sensitive resistor, or a current, the temperature sensitive resistor being positioned in the IC.

The device for accessing a reference IC temperature may e.g. be a signal line provided such as to access a reference temperature stored in an internal storage alternatively also comprised in the controller, alternatively the accessing device is an input for accessing a reference temperature inputted to the controller from an external storage.

In an embodiment of the invention the predetermined moment may be determined using a burst timing signal, the burst timing signal e.g. being provided when the burst is at its maximum, such as by a so called one-shot device, or the burst timing signal being provided at the starting time of the burst and hereby e.g. the end of the burst can be calculated from knowledge of the burst period, the burst timing signal also being inputted to the controller. Alternatively, the temperature is only inputted to the controller at the predetermined moment, e.g. due to a timing detection device, such as a one-shot device e.g. for detecting a burst end, only providing the sensed temperature at the predetermined moment to the controller. As a further alternative the temperature is only sensed when e.g. a one-shot device provides a signal to the IC temperature sensor, the signal signalling to the temperature sensor to sense a temperature. Additionally or alternatively a sample and hold device is used for sampling and holding the IC temperature. Alternatively or additionally the timing of the burst is provided to the controller from one or more timing signals provided by the power supply.

According to a third aspect of the invention, the invention relates to an IC system comprising an IC controller as previously described, and an IC to be controlled and a temperature sensor and one or more of the following group of elements: a power supply, a sample and hold device for sampling and holding the IC temperature, a burst timing detection device, a device using an output of the IC, a device using a power outputted by the IC. The sample moment for the sample and hold device to provide a sample is provided by the burst timing detection device. The burst timing device may be a device such as a one-shot.

According to a fourth, fifth and sixth aspect of the invention, the invention relates to a computer readable program enabling a processor to perform the described method, a computer readable carrier comprising the computer readable program and a method of making a computer readable program available for downloading.

In general by writing that 'it is an advantage' of the present invention or an embodiment of the present invention and referring to an advantage, it must be understood that this advantage may be seen as a possible advantage provided by the invention, but it may also be understood that the invention is particularly, but not exclusively, advantageous for obtaining the described advantage.

In general the various aspects and advantages of the invention may be combined and coupled in any way possible within the scope of the invention.

These and other aspects, features and/or advantages of the invention will be apparent from and elucidated with reference to the embodiments described hereinafter.

BRIEF DESCRIPTION OF THE DRAWINGS

Embodiments of the invention will be described, by way of example only, with reference to the drawings, in which FIG. 1A resembles a timeline with bursts and method steps.

DESCRIPTION OF EMBODIMENTS

Figures 1A, 1B:
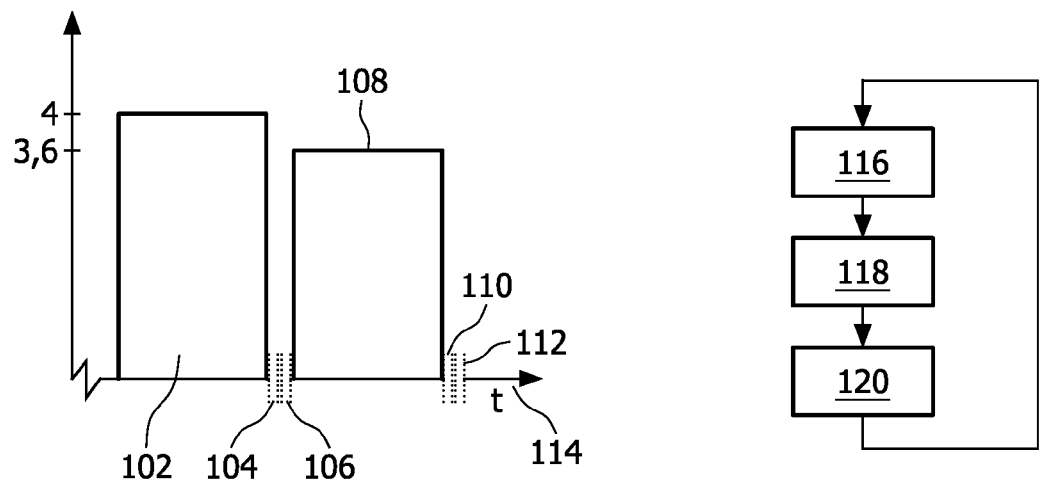
FIG. 1B resembles methods step.

In FIG. 1A an embodiment of the invention is illustrated. A timeline 114 is shown from left to right on the paper. A first box, extending over a relative long period compared to other boxes on the Figure, resembles a power burst 102 of an IC (not shown in FIG. 1) and is shown provided firstly on the timeline. A second box, similar to the first box, resembles a following power burst 108. The power burst 102 may be referred to as a previous power burst and the power burst 108 may be referred to as the next power burst.

The two power bursts 102 and 108 are consecutive to the extend that shown in between the two bursts, two boxes, both extending over a relative short period, are provided.

The box provided at the end of the previous burst 102 or as shown immediately following en end of the previous power burst 102, is resembling an IC temperature 104, sensed using a temperature sensor (not shown in FIG. 1), and sensed prior to a start of the power burst 108 and hereby resembles an IC temperature 104 obtained at a predetermined moment prior to a start of the burst 108.

The box provided when the IC temperature 104 is provided and shown just after the IC temperature 104, resembles a set allowable power 106 to be outputted by the IC during the burst 108, the allowable power being set prior to the start of the burst 108.

Similarly FIG. 1A shows the boxes 110 and 112, which resembles the obtained IC temperature obtained at a predetermined moment and an allowable power set for a not shown burst to follow.

It is shown that the burst 102 has an outputted level of power which equals 4 W. It is similarly shown that the burst 108 has an output level of power which is about 3.6 W. The burst 102 and 108 may be seen as the fifth and sixth burst, respectively, as further described in FIGS. 3-6. The Y axis does not apply to the boxes 104, 106, 110 and 112.

FIG. 1B shows a flow chart with three connected method steps 116, 118, 120 which follows each other in a continued operation. The method step 116 is showing the step of inputting power to an IC in a burst. The method step 118 is showing the method step of sensing and/or sampling the IC temperature. The third step 120 may be seen as the method step of setting an allowable power to be outputted by the IC in a following burst.

Figure 2:
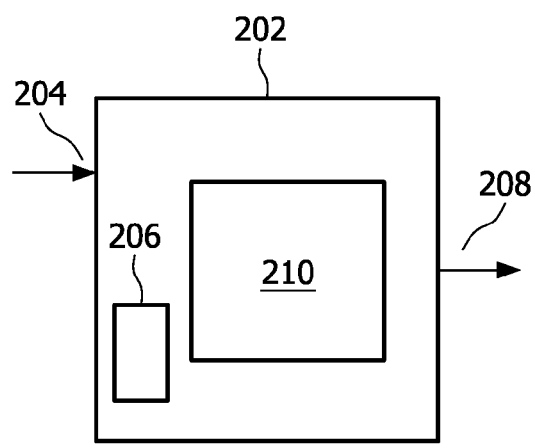
FIG. 2 shows an IC controller.

FIG. 2 shows an IC controller 202. The IC controller 202 is shown with an input 204, such as an electric connector or a terminal or a signal line, for inputting the sensed IC temperature.

Furthermore a device 206, such as an input or an electric connector or a terminal or a signal line, for accessing a reference IC temperature is shown within the controller 202. The device 206 is provided such as to access a reference temperature stored in an internal storage alternatively also comprised in the controller 202. As an alternative the accessing device is an input for accessing a reference temperature inputted to the controller from an external storage.

Control logic 210 is shown in FIG. 2, the control logic e.g. comprising any suitable processor, possibly comprising a calculator, a comparator, a storage, timing means or similar devices, e.g. for obtaining the IC temperature at a predetermined moment prior to the start of the burst 108 and for providing a comparison of the obtained IC temperature 104 obtained at the predetermined moment with the IC reference temperature.

FIG. 2 furthermore shows a control output 208 for outputting a control signal, the control signal comprising a signal for setting an allowable power 106 to be outputted by the IC, the allowable power being set prior to the start of the burst 108.

Figure 3:
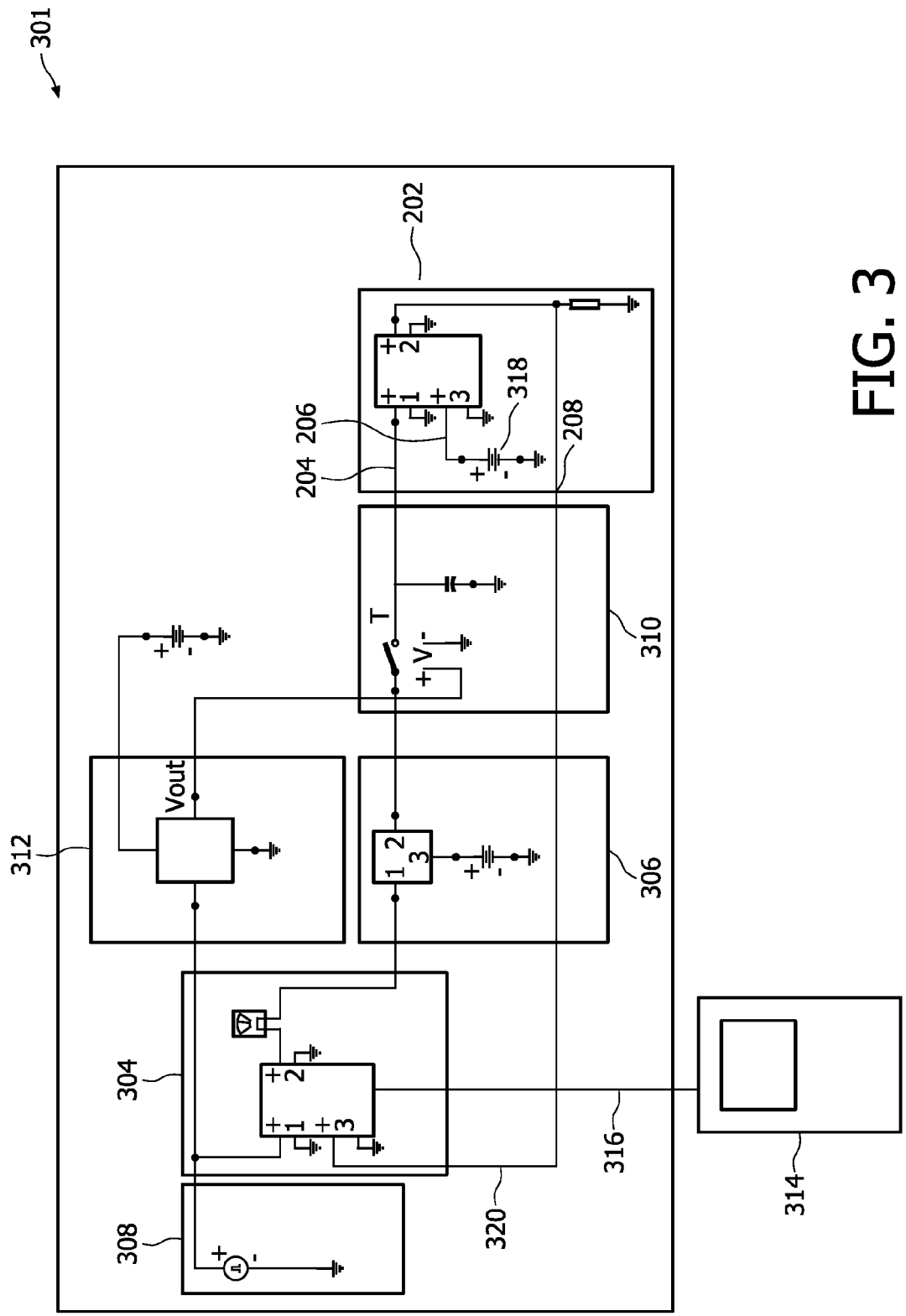
FIG. 3 shows a principle model of an IC system.

FIG. 3 shows a principle model of an IC system 301. The Figure shows the IC controller 202 with the input 204, in this example a signal line, for inputting the sensed IC temperature and with the device 206, in this example also a signal line for accessing a reference temperature inputted to the controller from an internal reference temperature storage 318 in the controller. In this example the storage 318 is a voltage source.

Still further the output control output 208 for outputting a control signal to be used in a temperature feedback control signal loop, where a feedback part of this loop is shown at 320. In this example the feedback provides a regulation of a gain of an amplification provided by the IC 304 and hereby provides a regulation of the power to be outputted by the IC 304.

The IC 304 is operated by the controller 202 in a way to control or limit the IC temperature, e.g. in order to prevent break-down of the IC due to overheating. The IC is in the system 301 shown with an associated temperature sensor 306 for sensing the IC temperature and a power supply 308 for supplying power to the IC in bursts.

A signal 316 outputted by the IC, in this example an outputted power, is shown used by a device 314. The device 314 may be a mobile phone such as a mobile phone such a mobile phone using TDMA, but may also be a non TDMA system.

In order for the IC temperature to be provided at a predetermined moment to the controller 202 a burst timing detection device 312, such as a herein so called one shot, for determining a certain event of a burst, in this example detecting a burst end of a burst provided by the power supply 308, is provided. Upon detection of the burst end, the sample and hold device 310 for sampling and holding the IC temperature, provides a sample of IC temperature to the controller 202.

The IC system 301 may be comprised within the device 314.

Figure 4:
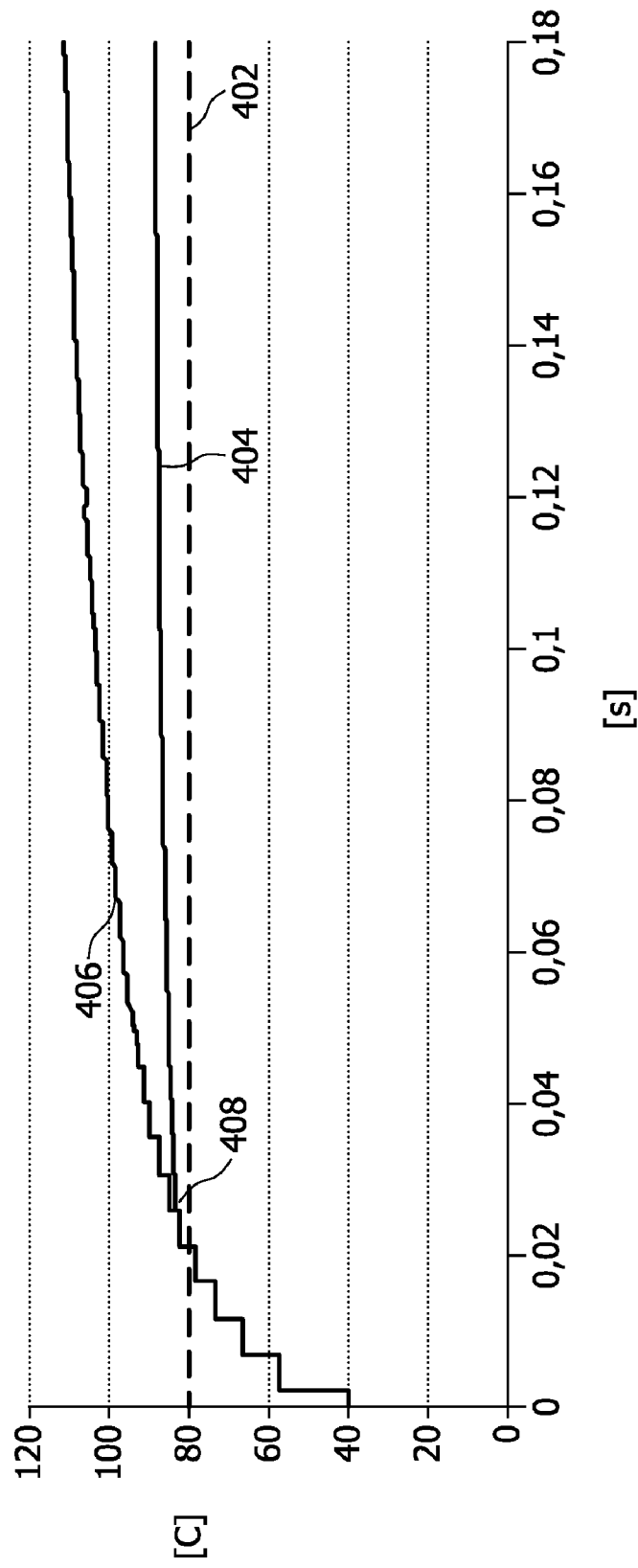
FIG. 4 shows a sampled sensor temperature as a function of time.

FIG. 4 shows a sampled sensor temperature, sampled at the end of each burst, as a function of time with 404 and without 406 the IC being operated in accordance with an embodiment of the invention and thereby protected by the controller 202. The dashed line 402 shows the reference IC temperature, in this example approximately 80 degrees Celsius at the integrated temperature sensor. 408 is the point of time after a fifth burst where the controller starts to control, and hereby regulates the power to be outputted in the sixth burst prior to the sixth burst. Please notice that the first vertical temperature level at around 40 degrees should not be counted as a burst.

The fifth burst is the first burst where the sensed and sampled IC temperature exceeds 80 degrees. It is seen from the Figure that the sensor temperature with the IC being protected flattens out at a level just above the reference temperature and around 85-90 degrees after a number of bursts. The sensor temperature does not keep increasing as the sensor temperature 406 in a system without the protection by the controller. Because the IC temperature is only sampled after every burst or at the end of every burst, changes in temperature will only be provided the feedback system at the sample moments.

Figure 5:
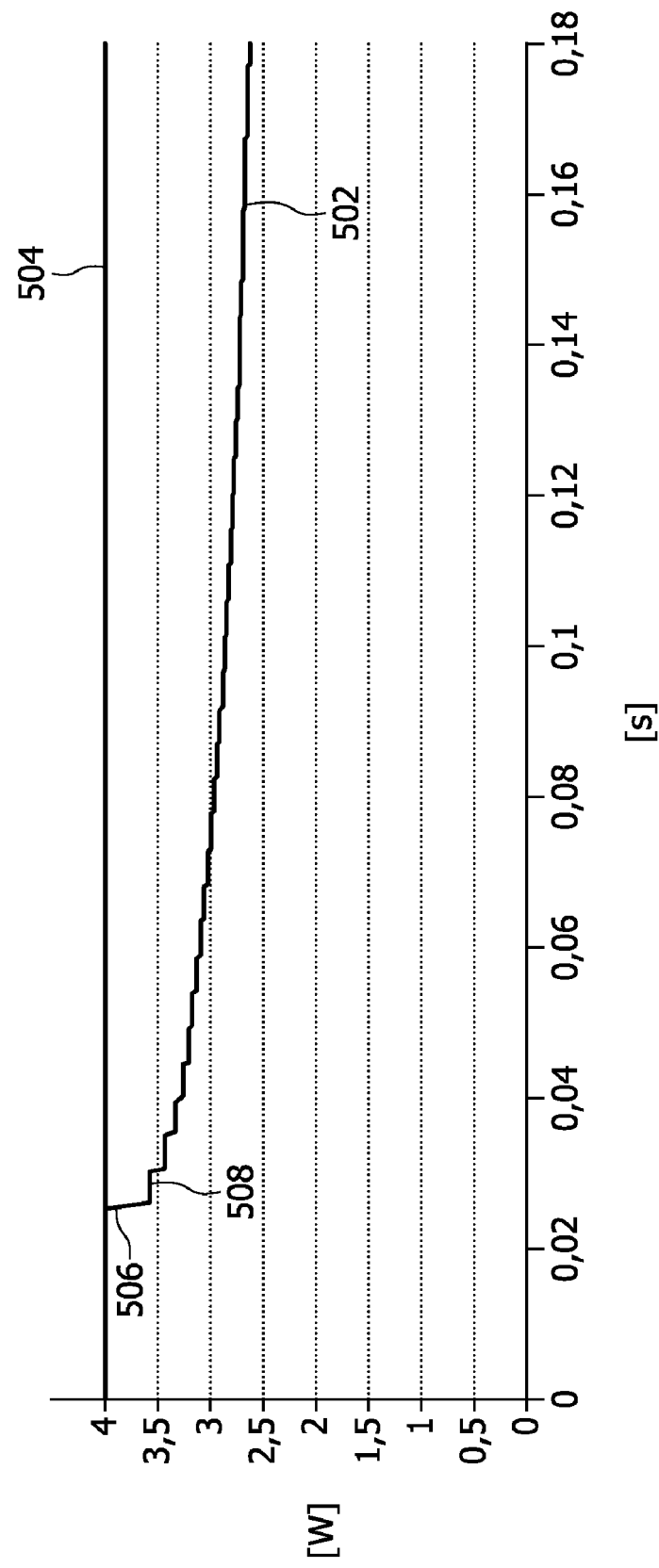
FIG. 5 shows a maximum outputted power as a function of time.

FIG. 5 shows a maximum outputted power of the IC in Watts as a function of time in seconds with 502 and without 504 thermal break-down protection. It is shown that the generated power by the IC is 4 Watts in the first five bursts and decreased after the fifth burst, shown at 506. It is shown that the power outputted is decreased relative much prior to the sixth burst and that the decrease of the power outputted decreases after each burst.

The amount of the decrease of the power outputted with respect to its non-regulated value, in this case 4W, is proportional to a change in an amount that the sensed IC temperature is above the reference temperature. In the present example the regulation is provided by the amount being subtracted from a control voltage of the power supply. In certain systems, such as polar power amplification systems, limiting supply voltage instead of the control voltage may be provided. The control voltage remains a value which equals the initial control voltage subtracted any amount proportional to a temperature difference as described above, at least until the next temperature sample is provided at the end of the next burst. The outputted power e.g. during the sixth burst is constant 508, can be seen from the Figure by noting that the generated output remains at flat line at a level of around 3.6 Watts during the sixth burst as shown at 508.

Figure 6:
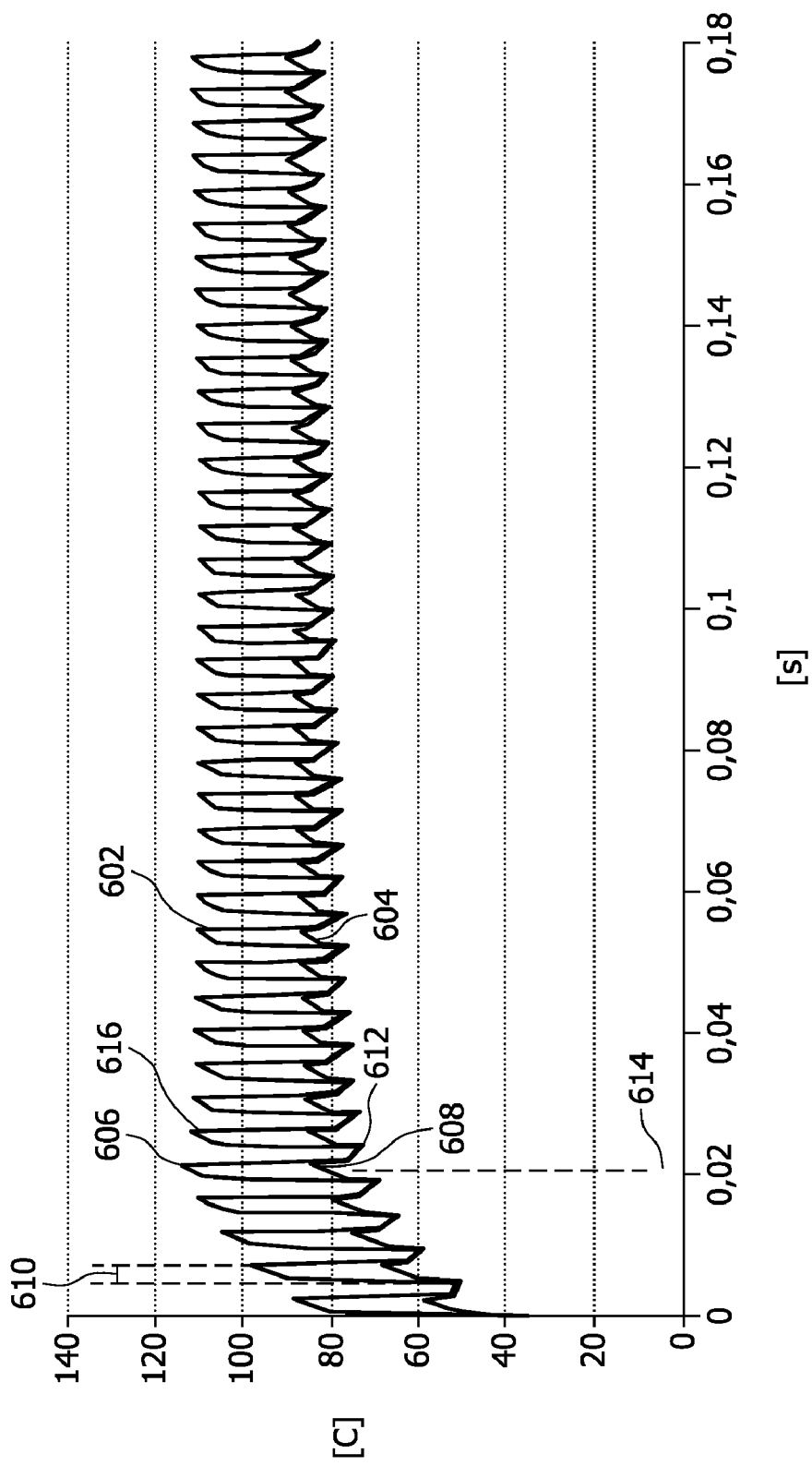
FIG. 6 shows a junction temperature and a sensor temperature as a function of time.

FIG. 6 shows a transistor junction temperature and the sensor temperature as a function of time when the IC is operated and the temperature is controlled in accordance with an embodiment of the invention. The curve 602 is the transistor junction temperature, that is, the temperature in the junction where the (unwanted) energy is mainly generated by the IC, and 604 is the temperature at the IC temperature sensor. The temperature of the sensor exceeds 80 degrees Celsius during the fifth burst, and when the temperature sample is provided, at the end of the fifth burst, at the point 608 the temperature is about 85 degrees Celsius. At substantially the same time the temperature in the junction is about 115 degrees Celsius as shown at 606. Accordingly, just after the temperature of 85 degrees Celsius is obtained, the power to be outputted by the IC in the sixth burst will be regulated prior to the sixth burst.

The burst duration is shown at 610 and has to a large extend a duration from the moment that the temperature rises in the junction until the moment that the temperature lowers in the junction again. 612 point to the beginning of the sixth burst. 614 point to the moment where the fifth burst is close to or at its end. 616 point to the sixth burst, or actually its points to the junction temperature in the sixth burst.

As an ending to the description and as described elsewhere herein, the present inventor has assessed that IC systems may suffer from limited lifetime e.g. due to overheating. Among others the invention discloses a method of operating an IC 304, the method comprising inputting power to the IC in bursts 102, 108, 116, sensing 118 an IC temperature using a temperature sensor 306, operating the IC by controlling the power 316 to be outputted by the IC during a burst 108, 116 in dependence of the sensed IC temperature compared to a reference IC temperature 318 using a controller 202, wherein the IC temperature is obtained at a predetermined moment prior to a start 612 of a burst 108, 616, and the IC is operated by setting 120 an allowable power 106 to be outputted by the IC prior to the start of said burst 108.

Although the present invention has been described in connection with preferred embodiments, it is not intended to be limited to the specific form set forth herein. Rather, the scope of the present invention is limited only by the accompanying claims.

In this section, certain specific details of the disclosed embodiment are set forth for purposes of explanation rather than limitation, so as to provide a clear and thorough understanding of the present invention. However, it should be understood readily by those skilled in this art, that the present invention may be practised in other embodiments which do not conform exactly to the details set forth herein, without departing significantly from the spirit and scope of this disclosure. Further, in this context, and for the purposes of brevity and clarity, detailed descriptions of well-known apparatus, circuits and methodology have been omitted so as to avoid unnecessary detail and possible confusion.

In the claims, the term "comprising" does not exclude the presence of other elements or steps. Additionally, although individual features may be included in different claims, these may possibly be advantageously combined, and the inclusion in different claims does not imply that a combination of features is not feasible and/or advantageous. In addition, singular references do not exclude a plurality. Thus, references to "a", "an", "first", "second" etc. do not preclude a plurality. Reference signs are included in the claims, however the inclusion of the reference signs is only for clarity reasons and should not be construed as limiting the scope of the claims.

The invention claimed is:

1. A method of operating an integrated circuit (IC), the method comprising:

inputting power to the IC in bursts using a power supply;

sensing an IC temperature using a temperature sensor; and operating the IC by controlling the power to be outputted by the IC during a burst in dependence on the sensed IC temperature compared to a reference IC temperature using a controller, wherein the IC temperature is sensed prior to a start of the burst, wherein the IC temperature is obtained at a predetermined moment prior to the start of the burst, and wherein operating the IC by controlling the power to be outputted by the IC is provided by setting an allowable power to be outputted by the IC prior to the start of the burst.

2. The method according to claim 1, wherein a sample of the sensed IC temperature is provided and the sampled IC temperature is used as the IC temperature obtained at the predetermined moment prior to the start of the burst.

3. The method according to claim 1, wherein a sample of the sensed IC temperature is obtained at the end of a previous burst and the sampled IC temperature is used for setting a maximum allowable power to be outputted by the IC prior to the start of a next burst.

4. The method according to claim 1, wherein the power to be outputted by the IC is controlled by a regulation of the power to be inputted to the IC, the regulation being provided prior to the burst.

5. The method according to claim 1, wherein the power to be outputted by the IC is controlled by a regulation of a gain of a power amplification, which power amplification is provided by the IC and wherein the regulation is provided prior to the burst.

6. The method according to claim 1, wherein a regulation of the power to be outputted by the IC in a next burst is only provided in a period between an end of a previous burst until a start of the next burst.

7. The method according to claim 1, wherein the power to be outputted by the IC in a next burst is controlled in dependence on a sampled and held IC temperature obtained during a previous burst prior to the next burst, which the sampled and held IC temperature is compared to the reference IC temperature.

8. The method according to claim 1, wherein setting a maximum level of power to be outputted by the IC during the burst results in the power to be outputted by the IC being decreased when the IC temperature obtained at the predetermined moment prior to the start of the burst is higher than the reference IC temperature.

9. An integrated circuit (IC) controller configured for use with an IC and a power supply configured to supply power to the IC in bursts, the IC controller configured for use with a temperature sensor sensing an IC temperature, the IC controller comprising:

an input configured to input the sensed IC temperature;
a device configured to access a reference IC temperature;
an output configured to output a control signal; and
a control logic, wherein the control logic is configured to obtain the sensed IC temperature at a predetermined moment prior to a start of the burst, and the control logic is further configured to operate the IC by controlling the power to be outputted by the IC by outputting the control signal, the control signal comprising a signal configured to set an allowable power to be outputted by the IC, the allowable power configured to be set prior to the start of the burst and the control signal configured to be set in dependence on a comparison of the obtained sensed IC temperature obtained at the predetermined moment with the reference IC temperature.

10. An IC system comprising the IC controller of claim 9, the IC to be controlled by the IC controller of claim 9, and the temperature sensor of claim 9, the IC system further comprising one or more of:

a sample and hold device for sampling and holding the IC temperature;
a burst timing detection device;
a device using an output of the IC; and
a device using a power outputted by the IC.

* * * * *